United States Patent [19]

Bull

[11] Patent Number: 4,941,255

[45] Date of Patent: Jul. 17, 1990

[54] METHOD FOR PRECISION MULTICHIP ASSEMBLY

[75] Inventor: David N. Bull, Brockport, N.Y.

[73] Assignee: Eastman Kodak Company, Rochester, N.Y.

[21] Appl. No.: 437,145

[22] Filed: Nov. 15, 1989

[51] Int. Cl.⁵ .............................................. H05K 3/30
[52] U.S. Cl. ........................................ 29/833; 29/407; 29/740; 29/840; 33/645; 156/64; 156/235; 156/241; 437/218
[58] Field of Search .................. 437/218; 29/833, 834, 29/740, 840, 407; 156/64, 235, 241; 33/645

[56] References Cited

U.S. PATENT DOCUMENTS

| | | | |
|---|---|---|---|
| 3,656,232 | 4/1972 | Hinchey | 29/624 |
| 3,658,618 | 4/1972 | Gramann | 156/235 |
| 3,690,984 | 9/1972 | Wanesky | 156/235 |
| 3,712,740 | 1/1973 | Hennings | 356/152 |
| 3,859,723 | 1/1975 | Hamer et al. | 29/626 |
| 3,871,936 | 3/1975 | Boyer et al. | 156/241 X |
| 3,887,996 | 6/1975 | Hartle Road et al. | 29/740 X |
| 3,899,379 | 8/1975 | Wanesky | 156/235 X |
| 3,982,979 | 9/1976 | Hentz et al. | 156/73.6 |
| 3,990,798 | 11/1976 | White | 356/172 |
| 4,070,229 | 1/1978 | Hentz et al. | 156/556 |
| 4,127,432 | 11/1978 | Kuwano et al. | 29/740 X |
| 4,222,036 | 9/1980 | Troukens | 340/286 |
| 4,292,116 | 9/1981 | Takahashi | 156/566 |
| 4,345,371 | 8/1982 | Ohsawa | 29/836 |
| 4,375,126 | 3/1983 | Düll et al. | 29/740 |
| 4,404,741 | 9/1983 | Lebet et al. | 29/721 |
| 4,571,826 | 2/1986 | Jacobs | 156/235 X |
| 4,675,993 | 6/1987 | Harada | 29/740 |
| 4,735,671 | 4/1988 | Stoffel et al. | 156/304.3 |
| 4,766,670 | 8/1988 | Gazdik et al. | 29/830 |
| 4,781,775 | 11/1988 | Reed et al. | 156/89 |
| 4,793,883 | 12/1988 | Sheyon et al. | 156/235 |

FOREIGN PATENT DOCUMENTS

| | | | |
|---|---|---|---|
| 242320 | 1/1987 | Fed. Rep. of Germany | 29/833 |
| 53-88573 | 8/1978 | Japan | 156/241 |

Primary Examiner—Carl E. Hall
Assistant Examiner—Carl J. Arbes
Attorney, Agent, or Firm—Raymond L. Owens

[57] ABSTRACT

A plurality of semiconductor chips are first attached to a transparent mask by placing indica marks on the mask and then viewing the chips through the mask and aligning them to the indica marks. The chips, which are held on a vacuum pedestal, are then brought into contact with the mask and a temporary adhesive layer holds the chips to the mask. The vacuum is then released. The mask with the chips attached thereto is then aligned to a printed circuit (wiring) board having indica marks thereon by viewing through the mask and moving the chips and printed circuit board together until they contact each other. A permanent adhesive layer holds the chips to the printed circuit board. The temporary adhesive layer is then dissolved and removed from the chips.

17 Claims, 1 Drawing Sheet

METHOD FOR PRECISION MULTICHIP ASSEMBLY

FIELD OF INVENTION

This invention relates to circuit assembly and more particularly to precise and reliable alignment of arrays of semiconductor devices upon an interconnecting substrate.

BACKGROUND OF THE INVENTION

Advances in semiconductor processing are leading to smaller dimensions for each electronic function and therefore a greater density of functions on each semiconductor chip. To further exploit the advantages of increased density, such as: greater speed, lower power, improved system reliability, and lower cost individual chips are packaged and interconnected into chip arrays upon a supporting substrate. These arrays perform such functions as memory, processing, optical sensing, or optical display. What the arrays all have in common is the need for precise alignment of the features on each chip to the coordinates of the substrate and/or each other. The need for precision is particularly acute in optical sensor and emitter arrays because the interrelationship of the chips contributes to the electronic output in image-processing applications. The difficulty in aligning semiconductor chips for optical applications is aggravated by chip geometry, which can range from a square of about one mm on a side to more than 25 mm on a side, and to a highly rectangular die with dimensions up to 70 mm and an aspect ratio of up to 20:1.

Prior art methods of assembly rely on various mechanical positioning devices or optical alignment schemes to precisely locate chips in a three-dimensional x,y,z coordinate array together with proper angular orientation. Many of these approaches suffer from the tolerance accumulation from (1) the accuracy of the saw cuts which separate the chips from their wafer, (2) the accuracy of the edges of mechanical templates which hold the chips in an array, and (3) the movement of the chips in the transfer operation to the interconnecting substrate. What is really needed is the alignment of the pattern on each chip to the pattern on the substrate or each other.

A series of advances have been made in the prior art through the use of temporary supports to mechanically align an array of chips. U.S. Pat. No. 4,766,670 (C. Gazdik et al) describes the use of a flexible polyimide film to hold an array of chips which are subsequently bonded, while being attached to the polyimide film, to a rigid substrate which serves as a heat sink. The precision with which an individual chip remains in relationship to other chips in the array is clearly limited by the dimensional stability of the organic polyimide film which changes with temperature and humidity.

In U.S. Pat. No. 4,375,126 (H. Dull, et al) a series of magazines feed plate-shaped chips to locations upon a transfer plate which correspond to the intended locations of the chips on a printed circuit board. In another embodiment a calibration plate is placed between the magazine ends and the transfer plate. The calibration plate has openings corresponding to the shape and location of the chips. It is movable in x and y directions and thereby cooperates with the transfer plate in aligning the array. There are necessary clearances in the openings in the calibration plate to allow chips fed from the magazine ends to enter and to allow these chips to be transferred to the printed board. These clearances limit the precision of locating chips in an array.

U.S. Pat. No. 4,345,371 (M. Ohsawa, et al) teaches the feeding of parts by magazines to cavities formed in the upper surface of a mechanical template. An adhesive is screened upon a printed wiring board at locations corresponding to the part locations. Then the printed wiring board is lowered, adhesive side down, upon the parts which protrude from the cavities in the template. The template-printed wiring board structure is then turned over, the template is lifted away and the adhesive is cured to hold the parts in place. The precision of location is limited by the clearances needed by the parts for entry into and egress of the parts from the cavities in the template. There is also no opportunity to observe the array in the turnover-transfer operation.

In U.S. Pat. No. 4,292,116 (T. Takahashi et al) the temporary support is a vacuum plate which lifts chips from a series of magazines which are arranged in the same spatial relationship as the intended location of the chips on a printed circuit board. The printed circuit board, coated with an adhesive, is moved below the parts which are held against the temporary support by vacuum, and then the board and support are moved together. The adhesive holds the chips to the board. Pressure is applied to release the chips and the support is removed In the Takahashi et al patent the tolerances between the chips in the array can never be better than the location of the magazines to each other. The density with which chips can be arranged is also limited by the wall thicknesses of adjacent magazines rather than by the ability to interconnect the chips.

Another transfer plate is described in U.S. Pat. Nos. 4,070,229 and 3,982,979 (L. J. Hentz et al) in which inverted, truncated pyramid shaped cavities are machined into a plate. Tubular members are centered in each cavity, are adapted to slide vertically within the cavities, and are resiliently supported by a vacuum chamber. Beam leaded semiconductor devices are placed on the ends of the tubular members. They are centered in the cavity as the tubular members are lowered with a vertical oscillatory motion which causes the devices to engage the walls of the cavity intermittently. A substrate coated with an adhesive is placed over the cavities and the tubular members are raised to press the devices against the adhesive. The mechanical tolerances in the edge of the device are added to the tolerances in machining a tapered cavity. The density of the device array is limited by the machinability of the tapered cavities without causing warpage.

U.S. Pat. No. 3,859,723 (G. H. Hamer et al) teaches a method for the simultaneous bonding of an array of flip-chip semiconductor devices by placing each flip-chip in an aperture in a metal template and by holding the chips in place with a high-temperature adhesive tape covering the back of the template. The template is registered over a substrate and thereafter the chips are bonded by soldering or thermocompression bonding. The tolerances between the various chips in the array are dominated by the mechanical tolerances on the edge of the chip and the clearances needed for passage of the chip into and out of the template.

Optical means of chip alignment are also described in the literature. In U.S. Pat. No. 4,675,993 (Y. Harada) a vacuum fastener picks up an electronic component from a tape reel, and an image sensor provides error signals to a numerical controller which positions a printed circuit board below the component. Great precision is achievable with numerical control, but the expense may not be justified in all instances.

U.S. Pat. No. 4,222,036 (T. Troukens) describes a method for positioning components on printed circuit boards using a projection display system to indicate the holes in the printed circuit board for the mounting of particular components. This position-locating aid is intended primarily for hand assembly.

A method of encapsulating coplanar microelectronic components is described in U.S. Pat. No. 3,656,232 (J. F. Hinchey) wherein a transparent mold plate containing gauge marks on its upper surface is coated with a mold release compound or wax which also serves to hold components placed on the mold plate from above. The mold plate rests upon a mirror. An operator views the gauge marks on the upper surface of the mold plate and the component above the mold plate reflected by the mirror at an angle to the vertical line of the chip movement during placement. Interconnection is achieved by casting an insulator around the components on the mold plate, releasing the mold plate, and electrically interconnecting the components. The parallax in viewing the gauge marks and the component above the marks at an angle impedes the rapid and accurate placement of a component in a precision array.

It is desirable to have a method for placing and bonding an array of semiconductor chips which are precisely located with respect to each other in orthogonal x, y, and z axes and also in angular orientation. It is also advantageous to inspect the array before bonding to the ultimate supporting member. Temporary supports for the array in the method should not contribute to inaccuracies in location due to dimensional changes with temperature and humidity. The packing density on the ultimate supporting member should be limited only by the constraints of interconnecting the chips, and not by the placement method.

SUMMARY OF THE INVENTION

The present invention is directed to a method for locating, bonding, and interconnecting arrays of semiconductor chips upon a support member with good precision of location of the chips to the support member and with respect to each other, reliability and yield. The method employs a transparent support member which may also be referred to as a mask. The mask carries indicia on one surface which bear a relationship to the final locations of the chips to each other and to the support member (which may also be referred to as a substrate, printed wiring board, or semiconductor wafer) on which they are supported. An individual chip is placed on a movable pedestal and held in place by vacuum. The pedestal carrying the chip is moved beneath the mask and aligned to the indicia on the mask by viewing through the mask from the upper surface opposite the indicia. The viewing means may be a microscope or video camera, and alignment in orthogonal coordinates x, y, and z, and angular orientation, theta, which angle is in the x-y plane is made by moving the pedestal manually or by signal processing and numerical control methods which are known. After alignment in x, y, and theta coordinates, the pedestal is raised in the z direction until the upper surface of the chip contacts a temporary adhesive on the bottom surface of the mask. These steps are repeated until the whole array is temporarily bonded to the bottom surface of the mask. An overall inspection of the placement of the chips in the array may be made at this time.

A first support member (which may be denoted as a substrate, printed wiring board, or semiconductor wafer) is coated with a permanent adhesive, positioned below the array of chips, and aligned to the array by viewing through the transparent mask. When the alignment is complete the substrate is raised until the chips contact the permanent adhesive. The permanent adhesive is then cured and the mask is removed by soaking the mask-substrate structure in a solvent or by exposing to light to dissolve or decompose, respectively, the temporary adhesive. The result is an array of chips lying in a z-plane with very accurate placement in x, y, and theta coordinates. The method places no restrictions on the packing density of the chips since the pedestal can be made smaller than the chip's outer dimensions. Inspection of the chip array prior to mass bonding the chips to the substrate also contributes to overall reliability and yield.

Viewed from another aspect, a method of the present invention is directed to positioning an article on a first support member having indicia marks thereon. The method comprises the steps of viewing from one surface of a transparent second support member and through the second support member the article which is separated from a second surface of the second support member; aligning the article with respect to second indicia marks on the second support member and coupling the article by a first surface thereof to the second surface of the second support member; viewing from the one surface of the second support member, which now has the article coupled thereto, the first indicia marks on the first support member; aligning the second support member to the first indicia marks and coupling the article by a second surface thereof to the first support member; and decoupling the second support member from the article.

These and other features and advantages of the invention will be better understood from consideration of the following detailed description and claims taken in conjunction with the accompanying drawings.

The drawings are not to scale.

DETAILED DESCRIPTION

Figure 1:
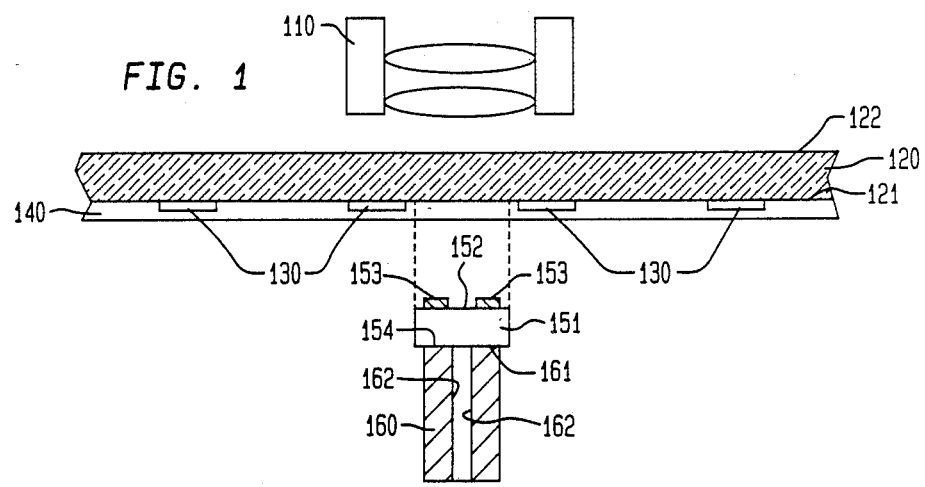
FIG. 1 shows a cross-sectional view of apparatus useful for temporary attachment of an integrated circuit (IC) chip to a temporary support member in accordance with a method of the present invention.
Figure 2:
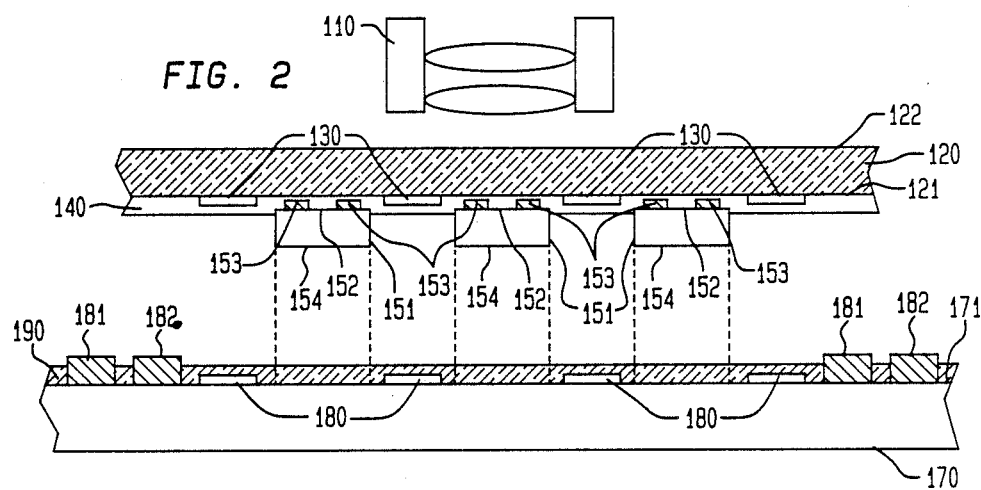
FIG. 2 shows an array of IC chips attached to the temporary support member of FIG. 1 prior to being attached to a permanent support member in accordance with the method of the present invention.
Figure 3:
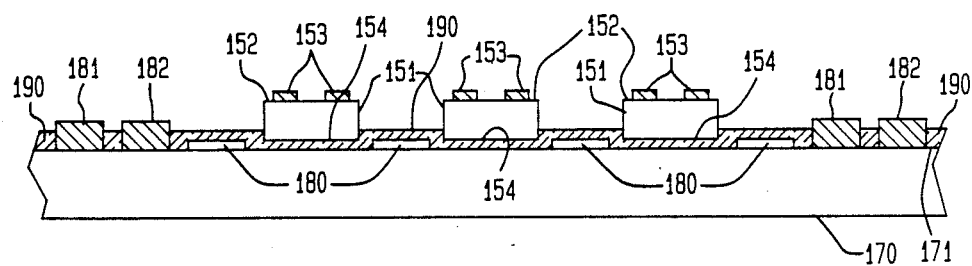
FIG. 3 shows the array of IC chips attached to the permanent support member in accordance with the methods of the present invention.

Referring now to FIG. 1, there is shown apparatus which is useful to implement a method in accordance with the present invention. The apparatus comprises a viewing means 110, a transparent temporary support member 120 having first 121 and second 122 essentially parallel and planar surfaces and a pedestal 160 having a tip portion 161 and sidewalls 162 which define a cylindrical opening therethrough to the tip portion 161. Indicia marks 130 adhere to portions of surface 121. Coupling means (e.g., a temporary adhesive layer) 140 adheres to surface 121. An integrated circuit (IC) chip 151, which has a top surface 152 with bonding pads 153 thereon and has a bottom surface 154, sits on top of the tip portion 161 of pedestal 160 and is typically selectively held in place by vacuum apparatus (not shown) which selectively reduces the pressure in the opening defined by sidewalls 162. Bottom surface 154 of chip 151 is to be permanently attached to a permanent support member 170 which is shown in FIGS. 2 and 3.

In various embodiments of the invention viewing apparatus 110 may be a microscope or a video camera, temporary support member 120 may be a planar, transparent mask upon which indicia 130 have been formed photolithographically, and coupling means 140 may be a temporary adhesive which is applied over first surface 121 and indicia 130 by spinning, spraying, or dipping. The viewing apparatus 110 may be a split or dual field microscope. All of the preceding apparatus and methods of forming and using same are well known in the art. The chip 151 is typically a semiconductor chip such as an optical sensor chip, a light emitting diode chip, a laser chip, a memory chip, a microprocessor chip, a custom logic chip, etc. Pedestal 160 is adapted to move in three orthogonal directions; x, y, and z; and to turn in an angle, theta, which is in the x-y plane.

The method of operation of the invention is as follows: an IC chip 151 is placed on the tip 161 of the pedestal 160. A vacuum is applied through the opening defined by sidewalls 162 so that the bottom surface 154 of the chip 151 is held to tip 161. The pedestal 160 and the IC chip 151 are next moved near mask 120 and then the indicia 130 are compared to the location of the IC chip 151 by viewing with microscope 110 through transparent mask 120 from a point beyond the second surface 122 of transparent mask 120. As is shown by the parallel vertical lines, the chip 151 is to be aligned between two adjacent indicia marks 130.

In some applications which require very accurate alignment of chips 151 to each other as well as to a permanent support member 170 (see FIGS. 2 and 3), the indica marks 130 are placed on transparent mask 120 at locations which correspond to the bonding pads 153 or other features or patterns (both not shown) on the top surface 152 of chip 151.

Typically the plane of the mask 120 is an x-y plane and that the z direction extends orthogonally from the x-y plane toward the microscope 110. The relative positions of the indicia marks 130 and the chip 151 are noted by a person (not shown) viewing through mask 120 with the aid of a microscope 110, or by a video camera (not shown) which is coupled to signal processing means (not shown) which are well known in the art. Pedestal 160 is then moved by the human being or by motors (not shown) which are controlled by said signal processing means, so that the differences in coordinates x, y, and theta between the indicia 130 and the chip 151 are acceptable small differences. The pedestal 160 is next moved a small distance in the z direction until the top surface 152 of the chip 151 contacts temporary adhesive layer 140. The pressure in the opening defined by sidewalls 162 is then raised so as to release the chip 151 from pedestal 160. Pedestal 160 is next moved away from the chip 151 in the z direction. A second chip 151 (shown in FIGS. 2 and 3) is then placed on pedestal 160 and the above described method is used again to place this second chip 151 onto the mask 120 at a preselected portion thereof. A third chip 151 is then placed on to the mask 140 in a preselected portion thereof in the same manner as the previous two chips 151. The result is shown in FIG. 2. The chips 151 are thus placed on and attached to a mask 140 and are accurately located on the mask 140 and with respect to each other. Fewer or more than three chips 151 may be attached to mask 120. Mechanical means (not shown) for controlling and moving pedestal 160 are well known.

In another embodiment of the invention holes (not shown) are provided in mask 120 passing from second surface 122 to first surface 121. These said holes are typically smaller than the outer dimensions of each chip 151. The holes are centered at the bonding sites of the chips 151. When a chip 151 is brought into contact with first surface 121 of mask 120, a temporary adhesive is applied to the top surface 152 of the chip 151 through each hole in the mask 120.

Referring now to FIG. 2, there are shown three chips 151 temporarily attached to the first surface 121 of transparent of the mask 120 by the temporary adhesive layer 140. The method of the invention continues with a permanent support member (substrate, printed circuit (wiring) board, semiconductor wafer) 170, which has a top surface 171 on which indicia 180 and a permanent coupling member (e.g., a permanent adhesive layer) 190 have been formed, being placed below mask 120 which now holds three chips 151. The permanent support member 170 can be coated with a permanent adhesive layer 190 by screen printing, resin transfer, dispensing, spinning, spraying or dipping. Permanent support member 170 is then brought in proximity to mask 120 to which the chips 151 are temporarily adhered. Second indicia 180 and the chips 151 are observed by viewing means 110 through transparent mask 120 from a point beyond second surface 122. The relative position of the chips 151 and second indicia 180 are noted by a person (not shown) with the aid of viewing means 110, or by a video camera (not shown) which is coupled to signal processing means (not shown) which are well known in the art. Permanent support member 170 is next moved by a person or by motors (not shown) which are controlled by the signal processing means, so that the difference in coordinates x, y, and theta between second indicia 180 and the chips 151 are acceptable small differences. Support member 170 is next moved a small distance in the z direction until the second surfaces 152 of the chips 151 are pressed into permanent adhesive layer 190.

The next step of the process is to cure permanent adhesive layer 190, typically by the application of heat. Mask 120 is then removed by soaking the mask 120 and chips 151 in an appropriate solvent for the temporary adhesive 140, or by decomposing temporary adhesive 140 by exposing it to optical energy (not indicated) applied through transparent mask 120. Mask 120 may be reused for other chips 151.

The net result of the use of the method of the present invention is the permanent attachment of chips 151 at desired locations on the permanent support member 170 and the accurate positioning of the chips 151 with respect to each other. The accurate positioning of the chips 151 with respect to each other is particularly important when the chips 151 are optical chips which are to receive external or internal light signals which must be incident thereon or to emit light signals which are to be incident upon chips 151 on the support permanent member 170 or on light detectors not located on permanent support member 170.

Referring now to FIG. 3, there is shown three IC chips 151 permanently mounted to permanent support member 170. Support member 170 supports on the surface 171 second indicia marks 180 and cured permanent adhesive 190. IC chips 151 are typically imbedded into and bonded by permanent adhesive 190. Surface 171 also has thereon conductors 181 and terminals 182 which serve to electrically interconnect the IC chips 51. Said electrical interconnection may be made by soldering, thermocompression bonding, thermosonic or ultrasonic wire bonding, laser welding, conductive adhesive bonding, or other methods which are known in the art, terminals (contact pads) 153, which are provided on surface 151 of each chip 151, and corresponding terminals 182 on surface 171 of support member 170.

It is understood that the embodiments described herein are merely illustrative of the general principles of the invention. Various modifications are possible consistent with the spirit of the invention. For example, a variety of jigs and fixtures can hold, move, and align pedestal 160 to predetermined locations on mask 120, and control mechanisms may automatically change the pressure in the opening defined by sidewalls 162 to hold or release a chip 151. Similarly a variety of jigs and fixtures can hold, move, align, and press together support member 170 and mask 120 to which IC chips 151 are adhered. Still further, a wide variety of electronic components or other types of articles can be permanently attached to a support member using the methods of the present invention. Furthermore, the permanent support member can be a semiconductor wafer. The semiconductor wafer and the chips 151 can all be silicon so as to match thermal characteristics of the wafer and the chips 151.

What is claimed is:

1. A method for positioning an article on a first support member having first indicia marks thereon comprising the steps of:
    viewing from one surface of a transparent second support member and through the second support member the article which is separated from a second surface of the second support member;
    aligning the article with respect to second indicia marks on the second support member and coupling the article by a first surface thereof to the second surface of the second support member;
    viewing from the one surface of the second support member, which now has the article coupled thereto, the first indicia marks on the first support member;
    aligning the second support member to the first indicia marks and coupling the article by a second surface thereof to the first support member; and
    decoupling the second support member from the article.

2. The method of claim 1 wherein the coupling of the article to the second support member is achieved by contacting the first surface of the article to a first adhesive layer on the second surface of the second support member and the coupling of the article to the first support member is achieved by contacting the second surface of the article to a second adhesive layer on the first support member.

3. The method of claim 2 further comprising the steps repeating the initial viewing and aligning steps so as to couple one or more additional articles to the second support member and then viewing and aligning all of the articles relative to the first indicia marks and coupling all of the articles to the first support member.

4. The method of claim 3 wherein the viewing steps are done through a microscope.

5. The method of claim 3 wherein the viewing steps are done through a television camera.

6. A method for locating an article on a first support member comprising the steps of:
    placing a transparent second support member in proximity to the article with a first surface of the article facing and being separated from a first surface of the second support member;
    aligning the article using indicia marks on the second support member to a predetermined location on the first surface of the second support member by viewing the article from a second surface of the second support member and through the second support member;
    coupling a first surface of the article to the first surface of the second support member at the predetermined location;
    placing the second support member having the article coupled thereto in proximity to the first support member with a second surface of the article facing the first support member;
    aligning the second support member, which now contains the article, using indicia marks on the first support member to a predetermined location on the first support member by viewing through the second support member from the second surface of the second support member;
    coupling a second surface of the article to the first support member at the predetermined location; and
    decoupling the second support member from the article.

7. A method for placing a plurality of semiconductor chips on a printed wiring board comprising the steps of:
    marking a substantially planar, transparent mask with indicia;
    aligning each of a plurality of chips which are separated from a first surface of the mask to the indicia by viewing each chip and the indicia from a second surface of the mask;
    attaching a first surface of each chip to the first surface of the mask;
    repeating the previous two steps for each of the plurality of chips;
    aligning the mask which has the chips attached thereto to the printed wiring board by viewing through the mask;
    attaching a second surface of each chip to the printed circuit board;
    releasing each of the chips from the mask; and removing the mask.

8. The method of claim 7 further comprising the steps of:
    applying a temporary adhesive to the mask such that the chips which contact the mask become attached to the mask; and
    applying a permanent adhesive to the printed wiring board such that the chips which contact the printed wiring board become attached thereto.

9. The method of claim 8 wherein the aligning of the articles to the mask is achieved by placing the chips on a movable pedestal and moving the pedestal toward the first surface of the mask until a first surface of each chip is brought into physical contact with the temporary adhesive;

10. A method for placing a plurality of semiconductor optical chips on an interconnecting carrier comprising the steps of:

marking a substantially planar, transparent mask with indicia on a first surface of the mask;

applying a temporary adhesive to the mask;

applying a permanent adhesive to the carrier;

holding each chip on a movable pedestal;

viewing each chip and the indicia through the mask from a second surface of the mask;

aligning each chip to selected indicia on the mask;

moving the pedestal toward the first surface of the mask until a first surface of each chip is brought into physical contact with the temporary adhesive;

releasing each chip from the pedestal;

repeating the previous five steps for each of the plurality of chips;

aligning the carrier relative to the mask;

moving the carrier toward the first surface of the mask until the second surface of each chip is brought into physical contact with the permanent adhesive; and releasing the bond between the first surface of each chip and the mask.

11. The method of claim 10 wherein some of the semiconductor optical chips are semiconductor light emitting diodes.

12. The method of claim 11 wherein some of the semiconductor optical chips are semiconductor optical sensors.

13. The method of claim 10 further comprising the steps of:

inspecting the planar and angular orientation of each chip on the mask; and electrically interconnecting terminals on the surfaces of each chip to corresponding terminals on the carrier.

14. The method of claim 13 wherein the method of electrically interconnecting the terminals on the chips to the terminals on the substrate may be selected from adhesive bonding, soldering, thermocompression, thermosonic or ultrasonic wire bonding, or laser welding.

15. The method of claim 10 wherein the step o releasing the temporary bond between the first surface of the chip and the mask is accomplished with the use of a solvent which dissolves the temporary adhesive.

16. The method of claim 10 wherein the step of releasing the temporary bond between the first surface of the chip and the mask is accomplished with the use of light energy to decompose the temporary adhesive.

17. The method of claim 10 wherein the permanent adhesive is cured by applying heat thereto.

* * * * *